United States Patent [19]

Domino et al.

[11] Patent Number: 4,553,060
[45] Date of Patent: Nov. 12, 1985

[54] ELECTROMECHANICAL RESONATOR APPARATUS

[75] Inventors: William J. Domino, Santa Ana; Donald P. Havens, Costa Mesa; Robert A. Johnson, Tustin, all of Calif.

[73] Assignee: Rockwell International Corporation, El Segundo, Calif.

[21] Appl. No.: 553,614

[22] Filed: Nov. 21, 1983

[51] Int. Cl.⁴ .......................................... H01L 41/08
[52] U.S. Cl. .................................. 310/333; 310/321; 310/368
[58] Field of Search ............... 310/333, 321, 369, 368; 333/187

[56] References Cited

U.S. PATENT DOCUMENTS 2,478,223  8/1949  Argabrite ........................ 310/333 X
3,859,546  1/1975  Doi et al. ........................ 310/333 X

FOREIGN PATENT DOCUMENTS 1950832   4/1971   Fed. Rep. of Germany ...... 310/333
0005550   1/1978   Japan ................................. 310/333
0127259  10/1979   Japan ................................. 333/187
 433622   9/1975   U.S.S.R. ............................ 310/321

Primary Examiner—Mark O. Budd
Attorney, Agent, or Firm—Bruce C. Lutz; V. Lawrence Sewell; H. Fredrick Hamann

[57] ABSTRACT

A torsional-mode resonator is produced by using an extensional mode transducer on a piece of material such as a metal bar where the transducer lies at an angle between the longitudinal axis of the material and the transverse axis. Placing the midpoint of the transducer at approximately the midpoint of the material such as the bar, optimizes the torsional effect. Further optimization may be obtained by making the transducer in the shape of a rhomboid.

3 Claims, 5 Drawing Figures

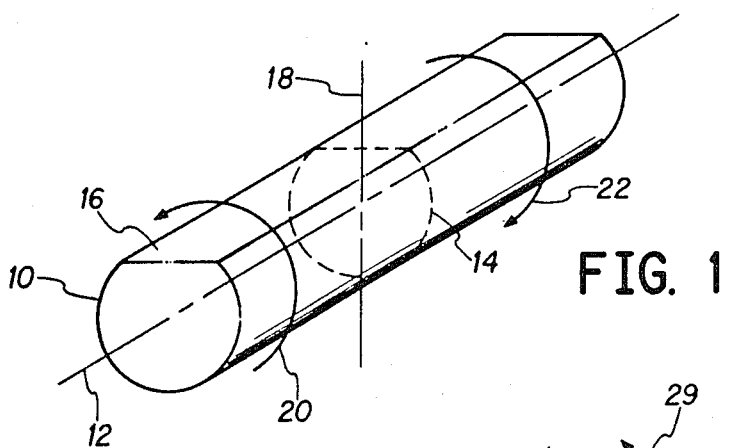
FIG. 1
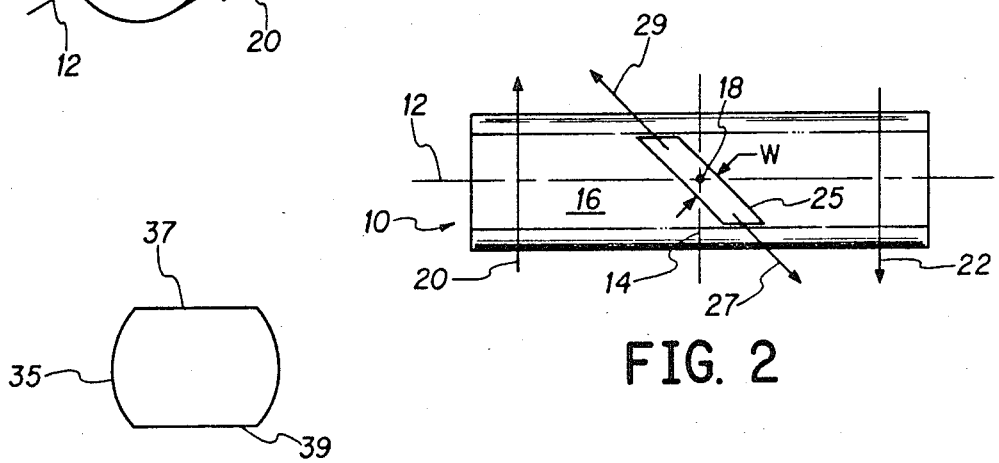
FIG. 2
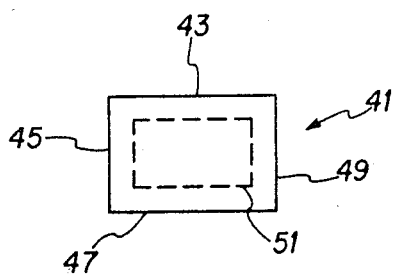
FIG. 3
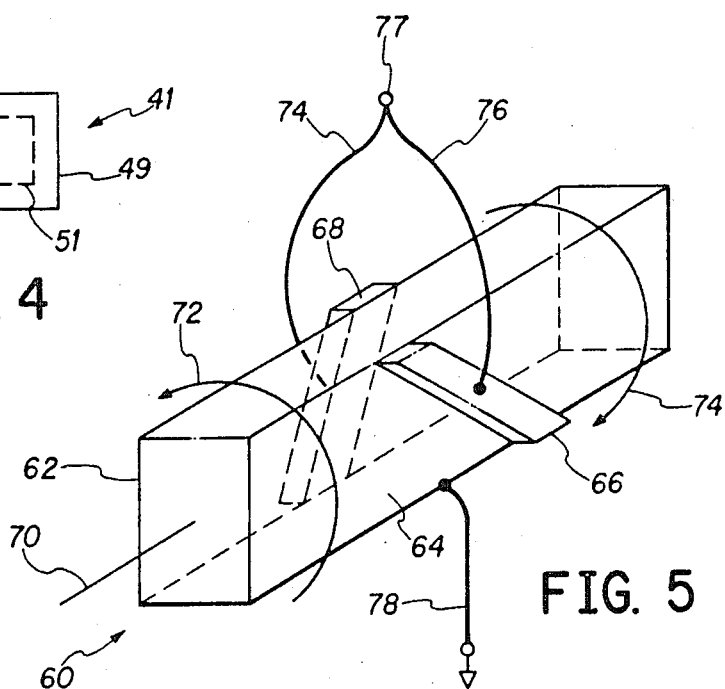
FIG. 4
FIG. 5

[4,553,060]

ELECTROMECHANICAL RESONATOR APPARATUS

THE INVENTION

The present invention is generally related to electromechanical filters and more specifically, is related to electromechanical resonators used as input and output transducers in multiresonator bandpass mechanical filters. The present invention is even more specifically related to instances where the electromechanical resonators need to operate in a torsional mode.

BACKGROUND

Electromechanical resonators are very often used as input and output transducers in multiresonator bandpass mechanical filters, and, as the filter itself, in the case of a single resonator mechanical filter. These electromechanical resonators have been designed to operate in numerous types or modes of vibration. Examples are torsion, flexure and extension. The transduction mechanisms for providing these modes of vibration have utilized the piezoelectric effect, magnetostriction and variable-reluctance magnetic effects.

Electromechanical resonators operating in the torsional mode have previously been used in the input and output of mechanical filters. These electromechanical resonators of the prior art are often coupled by wires to other torsional mode resonators wherein the composite resonator wire-coupled assembly forms a bandpass mechanical filter. These previously designed electromechanical resonators have used special piezoelectric ceramic transducers that are polarized in a direction parallel to the metal plated surfaces. This type of plated ceramic is more costly than other types such as those where the plated surfaces are used to polarize the material in a direction perpendicular to those surfaces. The parallel polarization, which excites a shear wave in the ceramic, requires plating removal and two metal parts per resonator in one embodiment and two ceramic pieces and a single metal part in another embodiment. The complexity of design of these prior art torsional resonators increases the time and cost necessary to produce same. In addition, when a part is more complex to produce, the reliability is often degraded accordingly.

The electromechanical resonator described herein as our invention, uses only one ceramic transducer and one metal base part in one embodiment. Other embodiments may use other base materials such as quartz and also the resonator can be produced using more than one transducer to further enhance various characteristics of the resonator.

It is thus an object of the present invention to improve the design of torsional electromechanical resonators, lower the cost and improve the reliability.

Other objects and advantages of the present inventive concept may be ascertained from a reading of the specification and appended claims in conjunction with the drawings wherein:

FIG. 1 is an isometric view of a bar of material used in practicing the inventive concept;

FIG. 2 is a top view of FIG. 1 with a transducer mounted on the bar to produce the resonator action;

FIG. 3 is a cross sectional view of a bar of material similar to that of FIG. 1;

FIG. 4 is a cross sectional view of a bar having a further possible shape for use in the present invention; and FIG. 5 is a isometric view of the present inventive concept utilizing two ceramic transducers.

DETAILED DESCRIPTION

In FIG. 1 a resonator bar or base means 10 is shown having a longitudinal axis 12 and a transverse section 14 in the center of the bar 10. A transverse axis may be described at any place in the section 14 but for convenience will be shown as rising through the center of a top or major surface 16 and the transverse axis is designated as 18. A pair of arrows indicating rotational movement 20 and 22 are used to indicate the direction of rotation of bar 10 when operating in a torsional mode.

In FIG. 2, the same numbers are used where applicable. In addition, on flat surface 16 there is shown a transducer element 25 having a width W and having its midpoint located coincident with the transverse axis 18. The transducer 25 operates in extensional mode in the directions shown by vectors 27 and 29. The transducer 25 is shaped in the form of a parallelogram and is attached to the surface 16 of bar 10.

In FIG. 3 a bar of material 35 is shown with two flat surfaces 37 and 39.

In FIG. 4 a bar of material 41 is shown with surfaces 43, 45, 47 and 49. In an optional embodiment, the bar 41 may be a tube and the dash line 51 indicates the inside surfaces of the walls of the surfaces 43 through 49.

In FIG. 5 a bar 60 is shown with flat surfaces 62 and 64 and having transducers 66 and 68 mounted on surfaces 64 and 62, respectively. The bar 60 has a longitudinal axis 70 and operates in a torsional mode indicated by arrows 72 and 74. A pair of leads 74 and 76 supply signals from a signal input means 77 to transducers 68 and 66, respectively. A base of bar 60 is connected to ground via a lead 78.

Throughout most of the discussion, the bar such as 10, will be described in terms of it being metal since it is easy to solder or otherwise attach the physical mounting means and the ceramic transducer as well as the torsional energy or movement transmitting means. However, the bar may be made of many other materials such as quartz and can be hollow as indicated in conjunction with FIG. 4. While a preferred embodiment is for a major portion of the bar to be rounded, it can also be square or any other shape within reason as long as satisfactory contact can be made between the transducer and a major surface of the base or bar means.

OPERATION

While the present concept will operate under many different configurations of a base material for the unit 10 of FIG. 1, it has been found in the past that if the base material is rounded in cross section where the resonator is connected to welded wires for interaction with other resonator elements, a more consistent acoustic coupling is obtained than if the wire or wires used for the coupling are welded to flat surfaces. However, attaching a transducer to a flat surface is much simpler than attempting to attach same to a rounded surface. Thus, the flat surface 16 was placed on the base 10 to provide an easy point of attachment of the transducer element 25 to the base means 10. As previously mentioned, transducer element 25, when excited, will operate in an extensional mode. A component of this extensional mode shown by one of the vectors 29 is in the longitudinal direction illustrated by longitudinal axis 12 and a further or remaining component is aligned with the transverse axis illustrated by the line formed by the intersection of the flat 16 and the plane 14. The component aligned with transverse plane 14 will rotate one end of element 10 in the direction shown by arrow 20. A component of vector 27 is in the same direction as rotational vector 22. This will produce a rotation or torsional effect of the other end of base means 10 while transducer element 25 is extending. When it is contracting, the directions of rotation of vectors 20 and 22 are reversed. Thus, it will be apparent that since the applied signal for a resonator is an alternating polarity signal relative a reference (i.e., an AC signal), the resonator shown will have each end rotating half the time in one direction and half the time in the other direction.

Although the transducer element 25 is shown centered on the base element 10, it can be attached at any point along the length of the base element 10 and the torsional effect of the base element is merely reduced from what it would be at the optimum point near the center of the base element 10 as illustrated by transverse axis 18.

The transducer element 25 is excited by applying the electrical signal across the electrically conductive plated upper surface (the "top" electrode) of element 25 and, where the base element 10 is a metal, the other terminal can be the base element 10 itself. The metal base therefore acts as the "bottom" electrode. The transducer element or ceramic bar 25 may be any shape and, in one embodiment, was a rectangle. However, it has been found that more torsional movement is obtained from a given width of the element 25 by utilizing slightly more of the surface 16 of base means 10 and constructing the transducer 25 in a rhomboid configuration. This configuration maximizes the surface contact area between the transducer element and the surface of the base means 10 without introducing deleterious effects such as would occur if the transducer element 25 were rectangular and extended over the edges of the flat area 16.

As is known to those skilled in the art, the term "electromechanical coupling" or "coupling coefficient" is related to the amount of energy that is converted from mechanical to electrical or electrical to mechanical in a cycle of a driving signal. A measure of this amount of conversion is the frequency difference between the pole (infinity) and zero of the input impedance across the electrodes of the transducer 25. The poles and zeros would occur in a graph illustrating the reactance across the electrodes of the transducer versus frequency of the signal. Thus, the electromechanical coupling coefficient equation, as is well known to those skilled in the art, is $k_{em}$ and is expressed by, $$k_{em} \approx \sqrt{\frac{2(f_z - f_p)}{f_p}}$$

In the above equation, $k_{em}$ is the coupling coefficient, $f_z$ is the frequency where the input impedance is minimum (near zero) and $f_p$ is the frequency where the input impedance is a maximum (towards infinity or, in other words, a pole).

The electromechanical coupling determines the maximum filter bandwidth that can be achieved when the resonator is used in a multielement mechanical filter or as a single element mechanical filter.

As will be realized, when the axis of the ceramic bar 25 lines up with the longitudinal axis 12 of bar 10 along the length of this bar, the value of $k_{em}$ goes to zero. Also, when the axis of the bar 25 is in a direction perpendicular to axis 12, or in other words, along the transverse plane 14, the value $k_{em}$ again goes to zero. Maximum coupling is achieved between these limits with the angle being dependent upon the shape of the transducer 25. The width W of bar 25 enters into the amount of coupling and, as would be suspected, the coupling goes to zero as the width W becomes zero. Although there is no readily known formula for optimizing the width, it will be realized that as the width becomes very large, the coupling is again reduced. While for one embodiment of the inventive concept it was desirable to use the shape of FIG. 1, other applications could very well use other shapes for the base material 10. Examples are shown in FIGS. 3, 4 and 5 and, in particular, in the dash line embodiment of FIG. 4, which shows that tubing may be used as well as solid base material. When there are flats on both sides such as FIGS. 3 and 4, transducers may be placed on both sides of the base 60 as shown in FIG. 5, or transducers could be placed on all four sides. A single ground wire 78 can be attached to the base 60 (if it is comprised of metal) and a pair of electrically connected terminals (lead wires) 74 and 76 can be attached to the outer surfaces of the transducer elements 66 and 68. In this way, the resonator of FIG. 5 may be used either as an input (electrical to mechanical) transducer or as an output transducer (mechanical to electrical). For this filter to operate, the polarity of each of the outside plated surfaces of the transducers must be the same. This double transducer resonator has the advantages of (1) the electromechanical coupling is increased and (2) the length-thickness flexure modes of the bar are suppressed due to the effects of each of the transducers canceling one another.

By using the lead wires 74 and 76 as input and output terminals, the resonator of FIG. 5 becomes a single resonant-element bandpass filter. Terminal 74 is attached to the signal generator through the source resistance and the terminal 76 is attached to one end of the load resistor. The source and the other end of the load resistor are attached to the terminal 78 bonded to the metal base 60.

SUMMARY

We have described an electromechanical resonator that vibrates in a torsional mode by being excited by a transducer preferably comprised of piezoelectric material attached to one or more flat surfaces thereof. As illustrated, this transducer is positioned on a flat major surface of the base material or rod at an angle that is between zero and 90 degrees from the longitudinal axis of the base. By varying the size, shape and angle of the transducer 25, the electromechanical coupling of the resonator can be varied to provide filters of various possible bandwidths.

While the resonator may have various cross sections, the rounded surfaces of FIGS. 1 and 3 are desirable for many applications because of the ease of consistently attaching coupling wires to the resonator base with the same mechanical effect at each attachment point.

While the resonator will typically be used with a single transducer plate of piezoelectric ceramic material, quartz and other piezoelectric materials may be used. However, multiple transducers can be used to increase the bandwidth or provide spurious suppression (cancel or at least substantially reduce the bending effect provided by the longitudinal axis portion of vector 29) or allow the resonator to be used as a single resonator bandpass filter.

Overall, the basic inventive concept presented herein is that an angled transducer on the flat surface of a base will provide a torsional-mode electromechanical resonator apparatus.

Thus, we claim:

1. Torsional resonator apparatus comprising in combination:
   resonator base means having a longitudinal and transverse axis and at least one flat surface; and
   unitary extensional transducer means having the shape of a rhomboid, attached to said resonator base means on said one flat surface thereof at an angle between said longitudinal and transverse axis of said resonating means, said transducer means being polarized in a single direction.

2. Apparatus as claimed in claim 1 wherein said base means includes a second flat surface; and
   a second unitary rhomboid shaped extensional transducer means mounted on said second flat surface for enhancing the torsional effect of said resonation base means.

3. Apparatus as claimed in claim 1 wherein said base means includes a second flat surface;
   a second unitary rhomboid shaped extensional transducer means mounted on said second flat surface; and
   signal input and output lead means, one of said input and output lead means being connected to said transducer means and the other being connected to said base means whereby a single-resonator bandpass filter is obtained.

* * * * *